(12) United States Patent
Nuebling et al.

(10) Patent No.: US 11,923,120 B2
(45) Date of Patent: Mar. 5, 2024

(54) CIRCUIT WITH TRANSFORMER AND CORRESPONDING METHOD

(71) Applicant: Infineon Technologies AG, Neubiberg (DE)

(72) Inventors: Marcus Nuebling, Olching-Esting (DE); Jaafar Mejri, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 560 days.

(21) Appl. No.: 17/074,473

(22) Filed: Oct. 19, 2020

(65) Prior Publication Data
US 2021/0134508 A1    May 6, 2021

(30) Foreign Application Priority Data
Oct. 30, 2019   (DE) .......................... 102019129260.3

(51) Int. Cl.
| | | |
|---|---|---|
| *H01F 27/00* | (2006.01) | |
| *G01R 31/62* | (2020.01) | |
| *H01F 27/32* | (2006.01) | |
| *H01F 38/14* | (2006.01) | |

(52) U.S. Cl.
CPC ........... *H01F 27/006* (2013.01); *G01R 31/62* (2020.01); *H01F 27/324* (2013.01); *H01F 38/14* (2013.01)

(58) Field of Classification Search
CPC ....... G01R 31/62; G01R 31/72; H01F 27/006; H01F 27/324; H01F 38/14; H01F 27/38; H01F 2027/2809; H01F 2038/143; H01F 27/2804; H01F 27/28; H01F 27/29
See application file for complete search history.

(56) References Cited

U.S. PATENT DOCUMENTS 1,781,308 A * 11/1930 Vos .................... H01F 27/2823
336/185
2,418,568 A *  4/1947 Brunton ................ H03B 21/01
331/51
3,667,034 A *  5/1972 Freeze ................... G01R 31/62
324/726

(Continued)

FOREIGN PATENT DOCUMENTS

DE        29701493 U1    3/1997
JP       2017211280 A   11/2017

OTHER PUBLICATIONS

"Astable multivibrator," Wikipedia, the free Encyclopedia, with English translation, last edit made Jun. 27, 2020, retrieved from https:l/de.wikipedia.orglwiki/Astabile_Kippstufe, 16 pp.

(Continued)

*Primary Examiner* — Bickey Dhakal
*Assistant Examiner* — Matthew T Sarles
(74) *Attorney, Agent, or Firm* — Shumaker & Sieffert, P.A.

(57) ABSTRACT

A circuit is provided that comprises a transformer having a first coil, which is arranged on a substrate, a second coil, which is arranged above the first coil on the substrate, and a dielectric between the first coil and the second coil. The circuit furthermore comprises a resonant circuit, which is couplable to the first coil and/or the second coil to form a resonant loop, wherein a measure of a characteristic frequency of the resonant loop and/or a measure of a power consumption of the resonant loop is able to be tapped off at an output of the resonant circuit.

A corresponding method is also provided.

10 Claims, 4 Drawing Sheets

(56) References Cited

U.S. PATENT DOCUMENTS

| | | | |
|---|---|---|---|
| 2010/0001268 A1 | 1/2010 | Frye et al. | |
| 2014/0152394 A1* | 6/2014 | Chen | G01R 35/00 |
| | | | 324/130 |
| 2014/0225791 A1 | 8/2014 | Baldischweiler et al. | |
| 2016/0078986 A1* | 3/2016 | Yoon | H01F 5/04 |
| | | | 336/83 |
| 2018/0075965 A1* | 3/2018 | Yoshioka | H01F 27/2823 |
| 2018/0372787 A1* | 12/2018 | Klapper | G01R 31/62 |
| 2019/0013141 A1* | 1/2019 | Yoon | H01F 27/292 |
| 2019/0180928 A1* | 6/2019 | Lee | H01F 27/24 |
| 2020/0090858 A1* | 3/2020 | Hong | H01F 27/323 |
| 2020/0168375 A1* | 5/2020 | Park | H01F 17/0013 |
| 2020/0219644 A1* | 7/2020 | Kim | H01F 27/2804 |
| 2020/0271716 A1* | 8/2020 | Cordier | G01R 31/2818 |
| 2020/0357564 A1* | 11/2020 | Kim | H01F 27/2804 |
| 2021/0110965 A1* | 4/2021 | Kawachi | H01F 27/29 |
| 2021/0134508 A1* | 5/2021 | Nuebling | H01F 27/324 |
| 2021/0210276 A1* | 7/2021 | Park | H01F 27/2885 |
| 2022/0020523 A1* | 1/2022 | Yoon | H01F 27/32 |
| 2022/0165485 A1* | 5/2022 | Cho | H01F 17/0013 |

OTHER PUBLICATIONS

Office Action, in the German language, from counterpart German Application No. 102019129260.3, dated Jun. 22, 2020, 7 pp.

\* cited by examiner

CIRCUIT WITH TRANSFORMER AND CORRESPONDING METHOD

This Application claims priority to German Application Number 102019129260.3, filed on Oct. 30, 2019, the entire content of which is incorporated herein by reference.

TECHNICAL FIELD

The present application relates to circuits having a transformer and a corresponding method, in particular circuits and methods that allow a diagnosis for coils of the transformer.

BACKGROUND

For different applications, for example automotive applications, signals need to be transmitted between different voltage domains, for example a circuit part that operates at high-voltage (for example in the range >20 V or >100 V, e.g. 400 V) and a circuit part that operates at low voltages (for example 5 V or 12 V). The aforementioned voltage values are intended to be understood only as examples.

One opportunity for signal transmission between the voltage domains in this case is provided by transformers. A specific type of such transformers is what are known as coreless transformers, in which coils of the transformer are arranged in different metal layers on a substrate, in particular a semiconductor substrate, with a dielectric in between. The coils are normally surrounded by a guard ring, which is grounded.

A transformer of this kind can be provided with signal transmission while simultaneously providing an isolation barrier that prevents the flow of currents, in particular DC currents, between the voltage domains.

Faults can occur during the production of the coils for such transformers. In particular in safety-critical applications, as exist in the automotive sector, it is desirable to be able to detect such faults. A conventional approach to this is visual inspection, which is time-consuming, however.

SYNOPSIS

A circuit according to Claim 1 and a method according to Claim 10 are provided. The subclaims define further embodiments.

According to one embodiment, a circuit is provided that comprises a transformer. The transformer has a first coil, which is arranged on a substrate, and a second coil, which is arranged above the first coil on the substrate, and also a dielectric between the first coil and the second coil. In addition, the circuit has a resonant circuit, which is couplable to the first coil and/or the second coil to form a resonant loop. A measure of a characteristic frequency of the resonant loop and/or a measure of a power consumption of the resonant loop is able to be tapped off at an output of the resonant circuit.

A corresponding method is also provided that comprises coupling a resonant circuit to a first coil or a second coil of such a transformer. The method furthermore comprises outputting a measure of the characteristic frequency of the resonant loop and/or a measure of a power consumption of the resonant loop.

The above synopsis provides just a brief overview of some exemplary embodiments and is not intended to be interpreted as limiting, since other exemplary embodiments can have different features than those discussed above.

DETAILED DESCRIPTION

Figure 1:
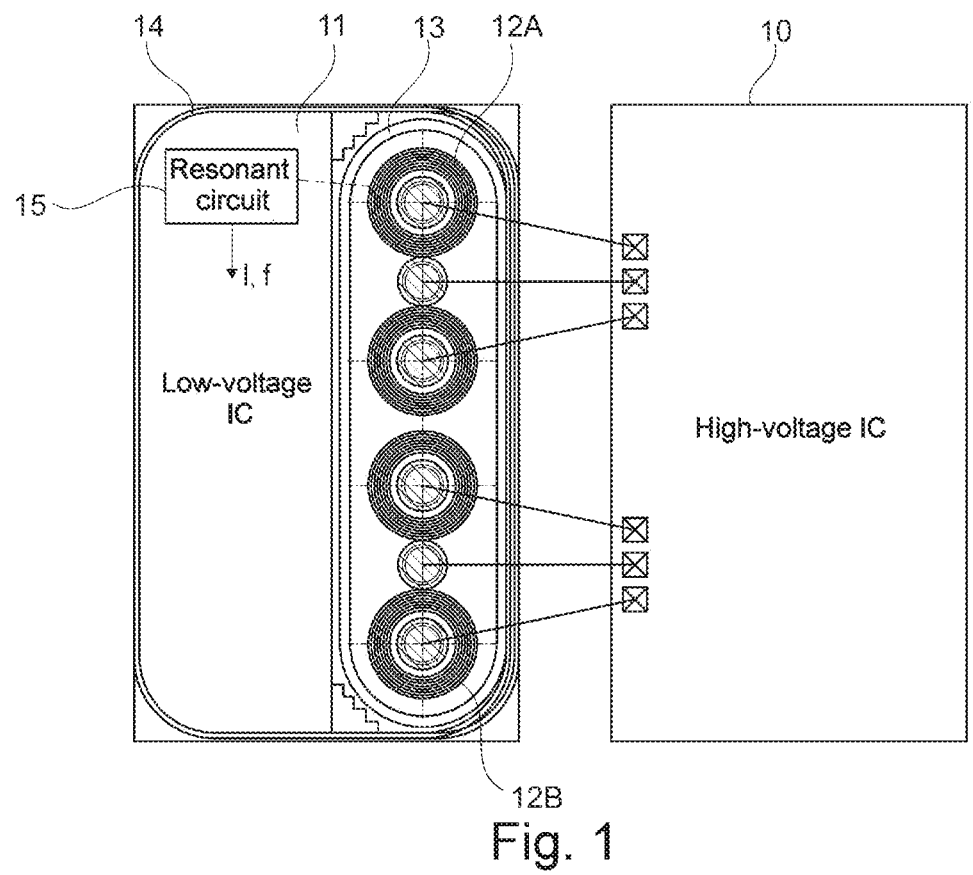
FIG. 1 is a plan view of a circuit according to an exemplary embodiment.

Various exemplary embodiments are explained in detail below. These exemplary embodiments serve only as examples and are not intended to be interpreted as limiting. By way of example, some of the features, components or method steps depicted can be omitted or replaced by alternative features, components or method steps in other exemplary embodiments. In addition to the explicitly depicted features, components or method steps it is also possible for further features, components or method steps to be provided, in particular features and components used in conventional transformer circuits, which are therefore not described explicitly here. Exemplary embodiments described below relate to testing of coils in what are known as coreless transformers. FIG. 1 is a diagram of a circuit according to an exemplary embodiment.

The circuit in FIG. 1 comprises a high-voltage integrated circuit 10 (high-voltage IC) and a low-voltage integrated circuit 11 (low-voltage IC). The terms "high-voltage" and "low-voltage" are initially intended to be understood relative to one another, i.e. the high-voltage integrated circuit 10 operates at higher voltages than the low-voltage integrated circuit 11. By way of example, the high-voltage integrated circuit 10 can operate at voltages >20 V or >100 V, e.g. 400 V.

The low-voltage integrated circuit 11 can comprise for example sensor circuits, computation circuits and/or logic circuits. It should be noted that any other type of circuits can also be used in the low-voltage integrated circuit 11 and in the high-voltage integrated circuit 10.

In some exemplary embodiments, the high-voltage integrated circuit 10 can comprise power transistors for switching high currents or voltages, e.g. for actuating a three-phase electric motor, and the low-voltage integrated circuit 11 can comprise a control circuit for controlling the power transistors.

In order to allow transmission of signals, e.g. control signals for the aforementioned power transistors, between the high-voltage integrated circuit 10 and the low-voltage integrated circuit 11, a transformer arrangement comprising a first transformer 12A and a second transformer 12B is provided. The transformers 12A, 12B can be used to transmit signals inductively between the high-voltage integrated circuit 10 and the low-voltage integrated circuit 11.

In the exemplary embodiment in FIG. 1, each transformer 12A, 12B has a differential design having two coil pairs. This can improve a quality of the signal transmission. Such differential or else single-pole designs of transformers can be produced in any conventional manner. The transformers 12A, 12B are coupled to the high-voltage integrated circuit 10 by means of bonding wires.

Figure 2:
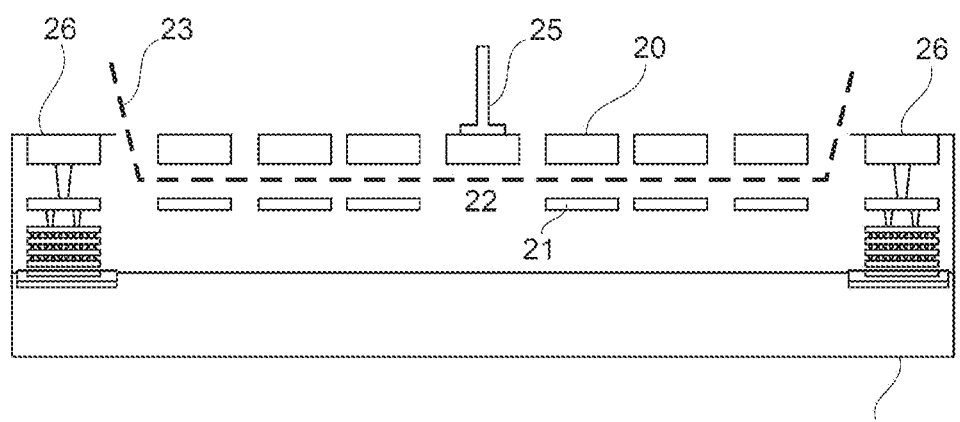
FIG. 2 is a schematic cross-sectional view of a part of the circuit in FIG. 1.

For illustrative purposes, FIG. 2 shows a simplified cross-sectional view of such a transformer. In the arrangement in FIG. 2, a first coil 21 is arranged in a first metal layer above a substrate 24 and a second coil 20 is arranged in a second metal layer above the substrate 24. The coils 20, 21 have a dielectric 22 arranged between them. The substrate 24 may be a semiconductor substrate on which, in the case of FIG. 1, the remainder of the low-voltage integrated circuit 11 is also formed. The first coil 20 is then connected to the high-voltage integrated circuit 10 by means of a bonding wire 25, while the second coil 21 is connected to the remainder of the low-voltage integrated circuit 11 by metal connections (not depicted), for example in the second metal layer of the second coil 21 or in further metal layers. Other coil pairs in a differential design of the transformer and further coil pairs of further transformers (for example the transformers 12A, 12B in FIG. 1) may be designed accordingly.

Arranged around the transformers 12A, 12B in FIG. 1 is a guard ring 13. This is separate from a guard ring 14 that surrounds the entire low-voltage integrated circuit 11. This separation of the guard rings 13 and 14 is shown clearly once again in FIG. 3.

The guard ring 13 may be formed for example by vertical connections (vias; "vertical interconnect access") of metal sections in multiple metal layers, as shown in FIG. 2 for a guard ring 26. In particular in the case of FIG. 2, these metal layers comprise the metal layers in which the first coil 20 and the second coil 21 are also formed.

The guard ring 13 in FIG. 1 and the guard ring 26 in FIG. 2 form a lateral isolation for the transformers. Such an arrangement containing transformers and a guard ring leads to an isolation barrier between a high-voltage domain of the high-voltage integrated circuit 10 and a low-voltage domain of the low-voltage integrated circuit 11. This isolation barrier is shown in dashes in FIG. 2 as isolation barrier 23.

Various defects can occur during the production of the coils for the transformers. In order to be able to detect such defects, the circuit in FIG. 1 has a resonant circuit 15, which is couplable to one or more of the coils of the transformers 12A, 12B. A resonant circuit in this case is a circuit that, together with the coil of the transformers 12A, 12B that has them coupled to it, can form a resonant loop, in particular an LC resonant loop, in which the coil(s) form(s) the inductance. The resonant circuit can also comprise components in order to supply power to the resonant loop thus formed and in this way to form an oscillator circuit. Such a resonant loop has a characteristic frequency f0. Moreover, the resonant loop has a power consumption on account of losses, in particular if it has an amplitude control loop. This is explained in more detail. A measure of the characteristic frequency f and/or a measure of the power consumption I are able to be tapped off from the resonant loop 15. Faults in the coils can be detected on the basis of the measure of the characteristic frequency and the measure of the power consumption, in particular if the measures thus determined for the characteristic frequency or the power consumption diverge from an expected value. As such, for example defects in the coils can change the inductance of the coils or the nonreactive resistance of the coils, which can influence both the characteristic frequency of the resonant loop and the power consumption of the resonant loop.

A measure of the characteristic frequency in this case is intended to be understood to mean a variable that permits inferences with regard to the characteristic frequency. In some exemplary embodiments, which are explained in more detail later, the measure is a signal that is obtained from an output signal of the resonant loop as a result of frequency division. Accordingly, a measure of a power consumption is a variable that permits inferences with regard to the power consumption. This may be for example a control parameter of a current control loop or a value that is obtained from a current measurement.

Figure 3:
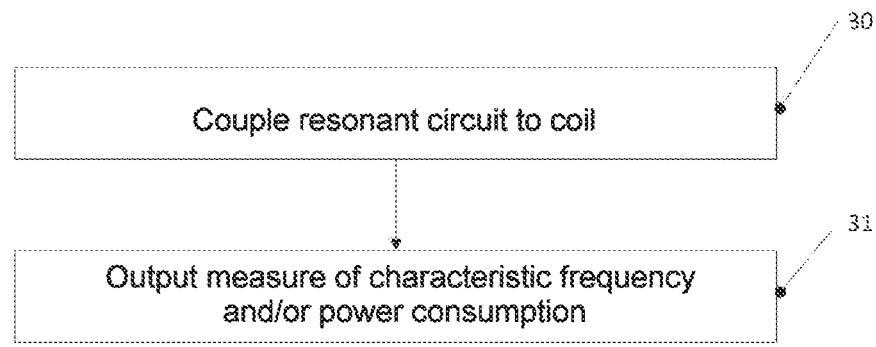
FIG. 3 is a flowchart to illustrate a method according to an exemplary embodiment.

A flowchart for a corresponding method is depicted in FIG. 3. The method in FIG. 3 can be used in the circuits in FIGS. 1 and 2, and is described with reference to the explanations above for the purpose of simplification. The method in FIG. 3 can also be applied to other circuits containing a corresponding transformer, however.

Figure 5:
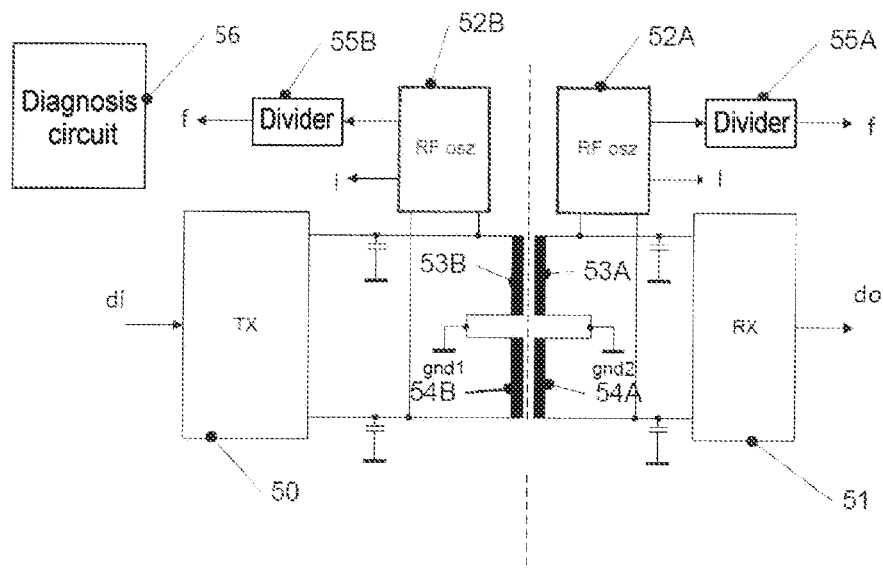
FIG. 5 is a diagram of a circuit according to an exemplary embodiment.
Figure 6:
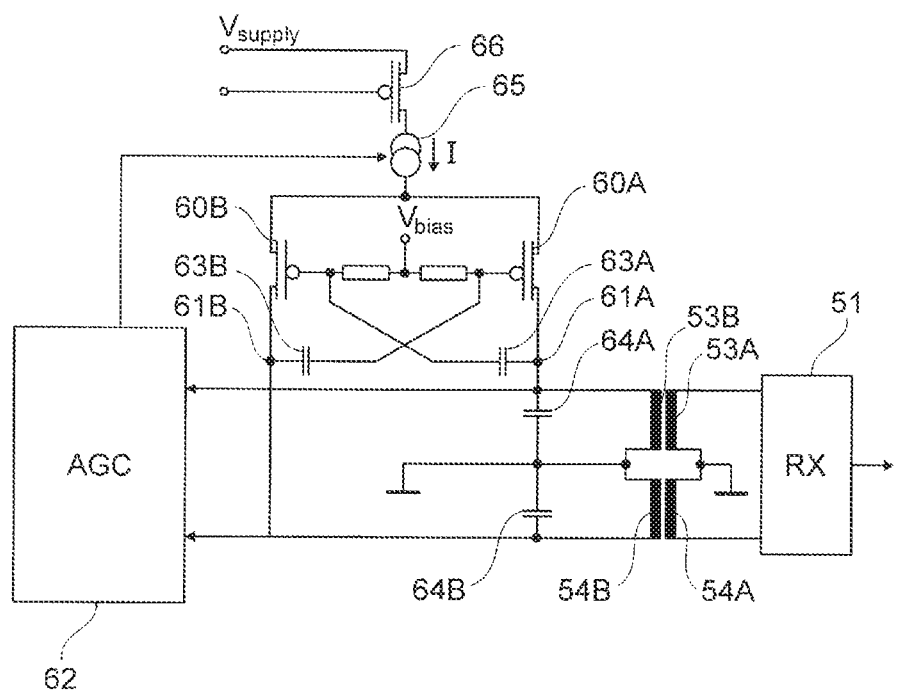
FIG. 6 is a diagram of a circuit according to a further exemplary embodiment.

At 30 a resonant circuit such as the resonant circuit 15 in FIG. 1 or resonant circuits described below with reference to FIGS. 5 and 6 is coupled to a coil or multiple coils of a transformer. This coupling can be performed in particular in a diagnosis mode. In a normal mode the resonant circuit may be decoupled from the coil, and/or the resonant circuit may be deactivated. In the normal mode it is then possible for signals as described to be transmitted via the transformer, for example between the low-voltage integrated circuit 11 and the high-voltage integrated circuit 10 in FIG. 1.

At 31 a measure of the characteristic frequency and/or the power consumption of a resonant loop formed by the resonant circuit together with the coil is then output. A defect in the coil can then be detected on the basis of the measure as explained.

Figure 4:
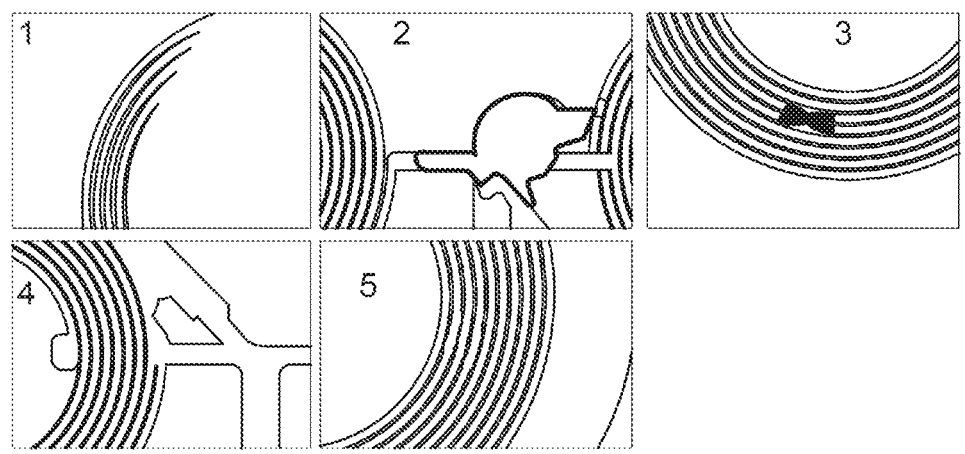
FIG. 4 comprises partial views of coils to illustrate different defects.

Various faults that can occur in coils and can be detected using techniques described here are depicted in images 1 to 5 in FIG. 3. Images 1 to 5 in FIG. 4 each show plan views of a part of a coil. In image 1, the turns of an upper coil (further away from the substrate) (e.g. coil 20 in FIG. 2) are shorted as a result of incorrect processing. In image 2, there is a high-impedance line present in a lower coil (situated closer to the substrate) (e.g. coil 21 in FIG. 2). In image 3, there is an interruption present in turns of the upper coil. In image 4, the outer turns of the upper coil are shorted. In image 5, there are shorts present within the upper coil.

Such faults change for example the inductance of the coils, which is reflected in the resonant frequency of the resonant loop formed by means of the resonant circuit 15. The nonreactive resistance of the coils and hence the current draw of the resonant loop are also influenced by such faults.

Such faults can therefore be detected on the basis of the measure of the resonant frequency and/or the measure of the power consumption. It should be noted that faults other than those shown in FIG. 4 can also be detected so long as they influence the nonreactive resistance and/or the inductance of the coils accordingly.

FIG. 5 shows a circuit according to a further exemplary embodiment. In the circuit in FIG. 5, signals are sent from a communication circuit 50, which serves as a transmitting circuit (TX) here, to a communication circuit 51, which serves as a receiving circuit (RX) here, via a transformer. The transformer here is a differential transformer for differential signal transmission having a first coil pair 53A, 53B and a second coil pair 54A, 54B. A first coil 53A of the first coil pair and a first coil 54A of the second coil pair are connected to the communication circuit 51 as depicted. A first connection of the first coil 53A and a second connection of the first coil 54A are connected to the communication circuit 51, while a second connection of the first coil 53A and a first connection of the first coil 54A are connected to ground. A second coil 53B of the first coil pair and a second coil 54B of the second coil pair are correspondingly connected to the communication circuit 50, a first connection of the second coil 53B and a second connection of the second coil 54B in turn being used for receiving signals from the communication circuit 50 and a second connection of the second coil 53B and a first connection of the second coil 54B being grounded.

The communication circuit 50 may be arranged for example in a low-voltage domain such as the low-voltage integrated circuit 11 and can receive signals di that are to be sent, which are then sent to the communication circuit 51 via the transformer and are output by said communication circuit as received signals do. Whereas in the exemplary embodiment in FIG. 5 the first communication circuit 50 is used for sending signals and the second communication circuit 51 is used for receiving signals, this can also be the other way round, or the communication circuits may be designed for bidirectional data transmission. Any conventional implementation of communication circuits for sending signals via a transformer can be used in this case. In the example in FIG. 5, the connections between the communication circuits 50, 51 and the respective coils 53A, 53B, 54A, 54B are moreover, as depicted, connected to ground via parasitic capacitances that result from the components of the circuit in FIG. 5 and the layout.

The circuit in FIG. 5 furthermore has a first resonant circuit 52A, which is coupled to the first coils 53A, 54A as depicted, and a second resonant circuit 52B, which is coupled to the second coils 53B, 54B as depicted. This coupling may be designed as selective coupling (for example by means of appropriate switches), so that the resonant circuits 52A, 52B are coupled to the respective coils only for diagnosis purposes and are decoupled therefrom in the normal mode, when signals are sent from the communication circuit 50 to the communication circuit 51. In some exemplary embodiments, the resonant circuits 52A, 52B are also coupled to the respective coils 53A, 54A and 53B, 54B only during a product test and then permanently deactivated. In other exemplary embodiments, the coupling can be performed repeatedly during a life of the circuit in order to detect effects occurring for the coils. Instead of decoupling, other exemplary embodiments can involve the oscillator circuit 52A or 52B also being de-energized in the normal mode, e.g decoupled from a supply.

The resonant circuit 52A and the coils 53A, 54A form a resonant loop, the characteristic frequency of which is determined by an inductance of the coils 53A, 54A and by capacitances of the resonant loop 52A. For diagnosis purposes, this resonant loop then oscillates at its characteristic frequency, for which purpose the resonant loop is supplied with current. An output signal having this characteristic frequency is then also divided by a frequency divider 55A in order to output an output signal f, the frequency of which is a measure of the characteristic frequency. In some applications, characteristic frequencies in the gigahertz range, for example approximately 8 GHz, can occur. The frequency divider 55A reduces this frequency, so that the output signal f is more easily processable by subsequent circuit parts. In other exemplary embodiments, the frequency divider 55A may also be omitted, however. Moreover, the oscillator circuit 52A outputs a measure of the power consumption I.

If for example there is a short present in a transformer winding, the effective inductance of the respective coil becomes lower and the oscillator frequency rises, since the characteristic frequency is $$f0 = 1/(2 \times \pi \sqrt{L \times C})$$

where L is the inductance of the coil and C is the capacitance (which can be made up of the capacitances of multiple capacitors) of the resonant loop. A divergence from an expected frequency that is brought about in this manner can be detected. If one turn of a coil has a higher impedance than it should, the quality of the resonant loop falls and the power consumption rises. Moreover, a short in a transformer winding can also influence the power consumption, and/or a high-impedance turn can influence the inductance and hence the frequency. It is therefore possible to detect such faults by evaluating the characteristic frequency and/or the power consumption. To this end, for example a diagnosis circuit 56 can be used to compare the measure of the characteristic frequency (signal f) and/or the measure of the power consumption (I) with expected values, and an error signal can be output in the event of a divergence that exceeds a predefined tolerance threshold.

The above explanations for the resonant circuit 52A with frequency divider 55A also apply correspondingly for the resonant circuit 52B and the frequency divider 55B for testing the second coils 53B, 54B.

An example of the design of such a resonant circuit is depicted in FIG. 6. Components that correspond to components in FIG. 5 bear the same reference signs therein and are not explained again.

FIG. 6 shows a resonant circuit that is coupled to the second coils 53B, 54B and can serve as an example of the resonant circuit 52B in FIG. 5. A resonant circuit of corresponding design may also (in line with the resonant circuit 52A in FIG. 5) be coupled to the first coils 53A, 54A. The communication circuit 50 is not depicted in FIG. 6 for the purpose of simplification.

The resonant circuit in FIG. 6 comprises a pair of transistors 60A, 60B that are cross-coupled via capacitors 63A, 63B and can be biased by a bias voltage $V_{bias}$ across resistors as depicted. Moreover, capacitors 64A, 64B are coupled in parallel with the second coils 53B, 54B. The resonant loop thus formed is supplied with power via a controllable current source 65, which is fed by a supply voltage $V_{supply}$. In this case, the resonant circuit thus also comprises components for supplying power to the resonant loop, as already as an option in the description relating to FIG. 1. A transistor 66 can be used to switch off the resonant circuit by isolating it from the supply voltage. As such, the resonant circuit can be switched off in a normal mode, for example, and activated only for diagnosis purposes.

The characteristic frequency of the resonant loop thus formed is determined by an inductance of the second coils 53B, 54B and a capacitance of the capacitors 63A, 63B, 64A, 64B in accordance with the formula above. An output signal from the resonant circuit having this frequency is able to be tapped off at nodes 61A, 61B and can then also be supplied to a frequency divider again, as already explained with reference to FIG. 5. The output signal from the resonant circuit is moreover supplied to an amplitude control loop 62 (AGC, Automatic Gain Control). This controls the current I supplied by the current source 65 such that the oscillation amplitude of the output signal from the resonant circuit assumes a predefined value. Any conventional amplitude control loop can be used here. The resultant current draw of the resonant loop formed by the resonant circuit and the second coils 53B, 54B can likewise be produced as explained above for analysis purposes. In particular, an increased resistance of the coils leads to a higher current draw. In this regard, the current I can be measured in a conventional manner, for example using a current mirror, a measuring transistor, a measuring resistor or the like, or control parameters of the amplitude control loop 62 can be used as a measure of the power consumption.

Figure 7:
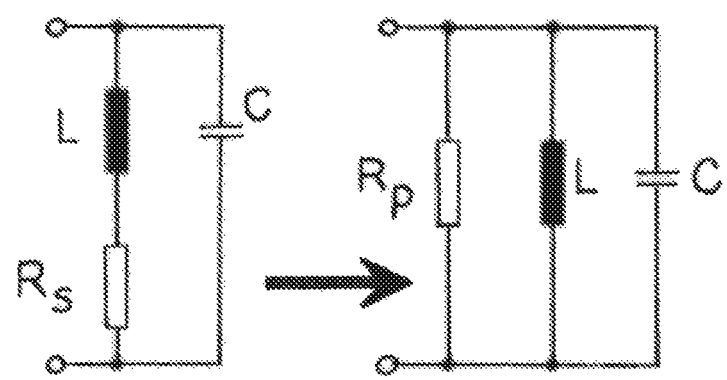
FIG. 7 is a diagram to illustrate a significance of a measurement of a power consumption of a resonant circuit for some exemplary embodiments.

The influence of the resistor on the power consumption is now also explained briefly with reference to FIG. 7.

As already explained, the coils and the capacitors of the resonant circuit together form a resonant loop. A simple equivalent circuit diagram for this resonant loop is shown in FIG. 7 on the left-hand side. Here, the coils are represented by a series circuit containing an ideal inductance L (i.e. an inductance without nonreactive resistance) and a series resistor $R_s$. The capacitors are represented by a capacitance C. As already explained above, a characteristic frequency $f_0$ of such a resonant loop is $$f_0 = 1/(2 \times \pi \sqrt{L \times C}).$$

The equivalent circuit diagram on the left-hand side in FIG. 7 can be replaced by the equivalent circuit diagram on the right-hand side in FIG. 7, in which, instead of the series resistor $R_s$ connected in series with the inductance L, there is a parallel resistor $R_p$ present. In this case it holds that $$R_p = L/(R_s \times C).$$

An amplitude of the oscillation is then obtained as $A = gm \times R_p$, where gm is a gain factor which is by the cross-coupled transistors 60A, 60B, which in turn is dependent on the magnitude of the current I. The higher the nonreactive resistance of the coils and hence $R_s$, the lower $R_p$ is and the higher the gain factor gm for a given amplitude needs to be. A higher power consumption is therefore required here, and the current draw can indicate an increased resistance of the coils.

Faults in coils can therefore be detected by various exemplary embodiments.

A few exemplary embodiments are defined by the examples that follow:

Example 1. Circuit, comprising:
a transformer having
  a first coil, which is arranged on a substrate,
  a second coil, which is arranged above the first coil on the substrate, and
  a dielectric between the first coil and the second coil, and
a resonant circuit, which is couplable to the first coil and/or the second coil to form a resonant loop, wherein a measure of a characteristic frequency of the resonant loop and/or a measure of a power consumption of the resonant loop is able to be tapped off at an output of the resonant circuit.

Example 2. Circuit according to Example 1, wherein the circuit is configured so as in a normal mode to transmit signals via the transformer and to decouple the resonant circuit from the first coil and the second coil and/or to deactivate the resonant circuit.

Example 3. Circuit according to Example 1 or 2, wherein the resonant circuit comprises a current control loop for a current through the resonant loop, which is configured to control an oscillation amplitude of the resonant loop.

Example 4. Circuit according to one of Examples 1 to 3, wherein the resonant circuit comprises a first resonant circuit, which is couplable to the first coil to form a first resonant loop and at the output of which a first characteristic frequency of the first resonant loop is able to be tapped off, and a second resonant circuit, which is couplable to the second coil to form a second resonant loop and at the output of which a second characteristic frequency of the second resonant loop is able to be tapped off.

Example 5. Circuit according to one of Examples 1 to 4, wherein the resonant circuit comprises a capacitance, wherein the characteristic frequency is determined by the capacitance and an inductance of the first coil or of the second coil.

Example 6. Circuit according to one of Examples 1 to 5, wherein the resonant circuit comprises a pair of cross-coupled transistors.

Example 7. Circuit according to one of Examples 1 to 6, furthermore comprising a diagnosis circuit, which is configured to detect a fault in the first coil or in the second coil on the basis of the characteristic frequency and/or the current.

Example 8. Circuit according to one of Examples 1 to 7, wherein the first coil comprises a first differential coil pair and the second coil comprises a second differential coil pair.

Example 9. Circuit according to one of Examples 1 to 8, wherein the resonant circuit furthermore comprises a frequency divider for dividing the characteristic frequency, wherein the divided characteristic frequency is able to be tapped off at the output as a measure of the characteristic frequency.

Example 10. Method, comprising:
  coupling a resonant circuit to a first coil or second coil of a transformer in order to form a resonant loop, wherein the first coil is arranged on a substrate, the second coil is arranged above the first coil on the substrate, and a dielectric is arranged between the first coil and the second coil, and
  outputting a measure of the characteristic frequency of the resonant loop and/or a measure of a power consumption of the resonant loop.

Example 11. Method according to Example 10, furthermore comprising, in a normal mode, transmitting signals via the transformer and decoupling the resonant circuit from the first coil and the second coil and/or deactivating the resonant circuit.

Example 12. Method according to Example 10 or 11, furthermore comprising controlling a current through the resonant loop in order to control an oscillation amplitude of the resonant loop.

Example 13. Method according to one of Examples 10 to 12, wherein the resonant circuit comprises a capacitance, wherein the characteristic frequency is determined by the capacitance and an inductance of the first coil or second coil.

Example 14. Method according to one of Examples 10 to 13, furthermore comprising detecting a fault in the first coil or in the second coil on the basis of the characteristic frequency and/or the current.

Example 15. Method according to one of Examples 10 to 14, furthermore comprising dividing the characteristic frequency, wherein the measure of the characteristic frequency is the divided characteristic frequency.

Although specific exemplary embodiments have been illustrated and described in this description, persons having standard knowledge in the art will recognize that a multiplicity of alternative and/or equivalent implementations can be chosen as a substitute for the specific exemplary embodiments shown and described in this description without departing from the scope of the invention shown. It is the intention for this application to cover all adaptations or variations of the specific exemplary embodiments that are discussed here. It is therefore intended that this invention is restricted only by the claims and the equivalents of the claims.

The invention claimed is:

1. A circuit comprising:
a transformer configured to transmit signals between two different voltage domains in a normal mode of the circuit, wherein the transformer includes:
a first coil arranged on a substrate,
a second coil arranged above the first coil on the substrate,
a dielectric between the first coil and the second coil, and
a grounded guard ring surrounding the first and second coils; and
a resonant circuit that includes an automatic gain control (AGC), wherein the resonant circuit that includes the AGC is couplable to the first coil and/or the second coil to form a resonant loop in a diagnostic mode of the circuit, wherein either the first coil or the second coil defines an inductance in the resonant loop and wherein a capacitance of the resonant loop is defined at least in part by an existing capacitance associated with the first coil or the second coil, wherein a measure of a characteristic frequency of the resonant loop and a measure of a current consumption of the resonant loop are output by the resonant circuit in the diagnostic mode of the circuit,
wherein the resonant loop within the resonant circuit that includes the AGC forms an oscillator circuit that defines the characteristic frequency and the current consumption, and
wherein the measure of the characteristic frequency of the resonant loop and the current consumption during the diagnostic mode of the circuit indicates whether a fault exists in the first and/or second coils of the transformer.

2. The circuit of claim 1, wherein the circuit is configured so as in the normal mode to transmit the signals via the transformer and to decouple the resonant circuit from the first coil and the second coil and/or to deactivate the resonant circuit.

3. The circuit of claim 1, wherein the AGC is configured to control a current through the resonant loop, wherein the current through the resonant loop defines an oscillation amplitude of the resonant loop.

4. The circuit of claim 1, wherein the resonant circuit comprises a first resonant circuit, which is couplable to the first coil to form a first resonant loop and a second resonant circuit, which is couplable to the second coil to form a second resonant loop,
wherein a measure of a characteristic frequency of the first resonant loop and a measure of a current consumption of the first resonant loop are output by the first resonant circuit in the diagnostic mode of the circuit, and
wherein a measure of a characteristic frequency of the second resonant loop and a measure of a current consumption of the second resonant loop are output by the second resonant circuit in the diagnostic mode of the circuit.

5. The circuit of claim 1, wherein the resonant circuit defines a further capacitance, wherein the capacitance of the resonance loop is defined by the existing capacitance associated with the first coil or the second coil and by the further capacitance associated with the resonant circuit.

6. The circuit of claim 1, wherein the resonant circuit comprises a pair of cross-coupled transistors.

7. The circuit of claim 1, further comprising a diagnosis circuit, which is configured to detect a fault in the first coil or in the second coil on the basis of the characteristic frequency and/or the current.

8. The circuit of claim 1, wherein the first coil comprises a first differential coil pair and the second coil comprises a second differential coil pair.

9. The circuit of claim 1, wherein the resonant circuit further comprises a frequency divider for dividing the characteristic frequency, wherein a divided characteristic frequency is output by the resonant circuit in the diagnostic mode of the circuit as a measure of the characteristic frequency.

10. The circuit of claim 1, wherein the measure of current consumption during the diagnostic mode of the circuit is defined by an oscillation amplitude of an output of the resonant circuit which is regulated to a defined value by the AGC in the diagnostic mode of the circuit.

* * * * *